United States Patent
An et al.

(10) Patent No.: US 7,710,188 B1
(45) Date of Patent: May 4, 2010

(54) LOW-NOISE, TEMPERATURE-INSENSITIVE, VOLTAGE OR CURRENT INPUT, ANALOG FRONT END ARCHITECTURE

(75) Inventors: Fu-Tai An, Mountain View, CA (US); Yingxuan Li, Cupertino, CA (US); Yonghua Song, Cupertino, CA (US)

(73) Assignee: Marvell International Ltd. (BM)

( * ) Notice: Subject to any disclaimer, the term of this patent is extended or adjusted under 35 U.S.C. 154(b) by 376 days.

(21) Appl. No.: 11/523,372

(22) Filed: Sep. 18, 2006

Related U.S. Application Data

(60) Provisional application No. 60/759,144, filed on Jan. 13, 2006.

(51) Int. Cl.
*H03K 17/687* (2006.01)
(52) U.S. Cl. .................... 327/427; 327/378
(58) Field of Classification Search ........... 327/108, 327/310, 318, 319, 378, 379, 512, 513, 261, 327/262, 158, 161
See application file for complete search history.

(56) References Cited

U.S. PATENT DOCUMENTS

| | | | |
|---|---|---|---|
| 6,690,192 B1 * | 2/2004 | Wing | 326/32 |
| 6,919,743 B2 * | 7/2005 | Tobita | 327/108 |
| 7,176,751 B2 * | 2/2007 | Giduturi et al. | 327/540 |
| 7,358,802 B2 * | 4/2008 | Chen | 330/9 |

* cited by examiner

*Primary Examiner*—Lincoln Donovan
*Assistant Examiner*—Colleen O'Toole

(57) ABSTRACT

AFE circuitry handles both voltage and current input signals. In one embodiment, both a voltage path and a current path are provided from the input. Switching circuitry selects one of the paths. A switch also turns on or off a current-to-voltage conversion circuit used to convert a current input into a voltage. In one embodiment, noise is significantly reduced by using a dedicated ground pin or terminal for the negative reference of a differential circuit. This applies the same external board noise, which is on the input signal, to the negative reference, so the noise is canceled in the differential signal. In one embodiment, temperature compensation is provided via an IPTAT circuit which is used to shift the voltage up in order to balance the decrease in DC voltage with increasing temperature.

25 Claims, 9 Drawing Sheets

LOW-NOISE, TEMPERATURE-INSENSITIVE, VOLTAGE OR CURRENT INPUT, ANALOG FRONT END ARCHITECTURE

CROSS-REFERENCES TO RELATED APPLICATIONS

This application claims priority from provisional application Ser. No. 60/759,144, entitled "A Low-Noise Temperature-Insensitive Versatile Analog Front End Architecture for Optical Storage Applications" filed on Jan. 13, 2006.

BACKGROUND OF THE INVENTION

The conventional Analog Front-End (AFE) circuitry, also known as the input network, of a DVD/CD drive or other devices is tailored for only one, or at most several very similar Optical Pick-Up Units (OPUs) or Photo-Detector Integrated Circuits (PDICs). It is nontrivial to support different varieties of OPUs or PDICs, not to mention that the challenge to support both voltage-mode and current-mode OPUs or PDICs is high. A voltage-mode OPU (or PDIC) converts the optical signals read back from the discs to electrical signals in the voltage format and delivers the signals to the AFE of the DVD/CD system chip. Current-mode OPUs (or PDICs), on the other hand, deliver information in terms of current to the AFE of DVD/CD system chip.

Traditional AFEs of the DVD/CD systems tend to consume excessive amounts of power since the signal is single-ended and is prone to the strong influence of the noise and crosstalk generated both on the printed circuit board (PCB) and on the chip. Also, the common-mode level of the signal can drift substantially due to temperature variation. This hinders the effectiveness of the calibration and can demand multiple calibrations during normal operations.

BRIEF SUMMARY OF THE INVENTION

The present invention provides AFE circuitry which can handle both voltage and current input signals. In one embodiment, both a voltage path and a current path are provided from the input. Switching circuitry selects one of the paths. A switch also turns on or off a current-to-voltage conversion circuit used to convert a current input into a voltage.

In one embodiment, the selected signal is provided through a source follower to a sampling circuit, a level shifter and a differential circuit.

In one embodiment, noise is significantly reduces by using a dedicated ground pin or terminal for the negative reference of the differential circuit. This applies the same external board noise, which is on the input signal, to the negative reference, so it is canceled in the differential signal. A reference master can be used, which supplies the negative reference to a plurality of slave reference circuits, each being connected to the negative input of a different differential circuit.

In one embodiment, temperature compensation is provided using an IPTAT circuit which is used to increase the voltage to cancel the decrease in voltage with increasing temperature. This is applied between the level shifter and the differential circuit input in one embodiment.

In one embodiment, the invention provides means for handling an input to an analog front end circuit. Means are provided for switching on and off a current to voltage conversion circuit in accordance with whether an input signal is a voltage or current; and means for switching a selection between a voltage path for a voltage input signal and a current path for a current input signal. Also provided are: means for sampling the input signal, means for level shifting said input signal; means for converting said input signal into a differential signal with a differential circuit; means for dedicating a ground terminal to a negative input of said differential circuit; means for dedicating said ground terminal to the negative inputs of a plurality of differential circuits; means for generating a master reference signal in communication with said dedicated ground terminal; means for providing said master reference signal to a plurality of local slave reference circuits, each connected to one of said negative inputs of said plurality of differential circuits; means for providing temperature compensation to a voltage level of said input signal.

In a further embodiment, means are provided for handling an input to an analog front end circuit comprising means for switching on and off a current to voltage conversion circuit in accordance with whether an input signal is a voltage or current; means for switching a selection between a voltage path for a voltage input signal and a current path for a current input signal: means for converting said input signal into a differential signal with a differential circuit; means for dedicating a ground terminal to a negative input of said differential circuit; and means for providing temperature compensation to a voltage level of said input signal.

In another embodiment, means are provided for handling an input to an analog front end circuit comprising: means for providing an input signal to an input terminal; means for level shifting a voltage generated from said input signal; means for converting said voltage into a differential signal using a differential circuit; means for dedicating a ground terminal to a negative input of said differential circuit; means for dedicating said ground terminal to the negative inputs of a plurality of differential circuits; means for generating a master reference signal in communication with said dedicated ground terminal; and means for providing said master reference signal to a plurality of local slave reference circuits, each connected to one of said negative inputs of said plurality of differential circuits.

1. Supporting Both Voltage Mode and Current Mode Operation:

One of the most critical tasks of the AFE of the DVD/CD system is to perform the single ended-to-differential-conversion of the input signals. To achieve the this goal, the DC common mode of the signal has to be shifted to the right level for the rest of the circuit to process the differential signal. For voltage-mode operation, usually level-shifting circuitry is involved to manipulate the DC level. For current-mode operation, usually a (variable) termination resistor is terminated to a specific voltage level to perform the current-to-voltage conversion. Supporting both voltage-mode and current mode operation for traditional AFE requires doubling the silicon area and power penalties.

2. Ground Noise Mismatch During Single-Ended to Differential Conversion:

The characteristics of the ground noise on the PCB and the noise on the chip are essentially very different. While the single-ended signals from the OPU (PDIC) are referring to the ground (VSS) of the PCB, the ground noise cannot be cancelled during the single-ended to differential conversion. Moreover, the different characteristics of on-chip and on-board noise can exacerbate the system's signal-to-noise ratio (SNR).

FIG. 1A shows an ideal scenario, although impossible in a real system, where the noise on the signal path and reference path are identical and cancel each other during the single-ended- to differential conversion. A chip 10 is shown with an input 12 to a level shifter 14. The signal provided to input 12 is a combination of a desired voltage signal 16 ($V_{SIG}$) and undesired noise 18 ($V_{NG}$). These signals are referenced to a printed circuit board (PCB) ground 20.

On the chip, the level shifted signal from level shifter 14 is applied to a positive input of an amplifier 22, which references the input to a voltage reference 24 applied to the negative input. The output of amplifier 22 is a differential signal across signal lines 26, 28. Voltage reference 24 has noise coupled to it, represented by noise voltage 30, which is referenced to on-chip ground 32. Ideally, both PCB ground 20 and chip ground 32 would cause the same noise $V_{NG}$ due to coupling of signal changes from other circuits. This would allow the noise at the negative and positive inputs of amplifier 22 to cancel.

However, in a real system as illustrated in FIG. 1B, the PCB ground noise 18' ($V_{NG\_B}$) is different from the on-chip ground noise 30' ($V_{NG\_C}$). Thus, they do not cancel at the input of amplifier 22.

3. Common Mode Drifting Due to Temperature Variation:

Before actual operation of the device (such as reading and writing for an optical disc control circuit), the system performs calibration such that the level-shifting circuitry of the AFE can properly place the DC common mode of the input signal at the right internal common mode reference value. However, after operation is initiated, the temperature inside the chip changes and so do the characteristics of the transistors. After a chip is powered up, it warms up over time, and the temperature changes. Therefore, the initial level shifting is no longer correct. This affects the dynamic range of the differential circuits. A new calibration may be performed, but it will slow down the normal operation.

FIG. 2A shows a portion of the circuit from FIGS. 1A-B. The output signal of the level shifter 14 at a node 34 ($V_X$) is calibrated to the desired value using control inputs 36 to level shifter 14 in a manner well known to those of skill in the art. However, as illustrated in FIG. 2B, the voltage $V_X$ decreases as temperature increases, requiring continually re-calibrating. As shown in FIG. 2C, this causes the signal at one level 40 at low temperature to drop to a lower level 42 at high temperature.

DETAILED DESCRIPTION OF THE INVENTION

Embodiments of the Present Invention

The analog front-end architecture in one embodiment of the invention supports multiple standards of optical storage applications and various Optical Pick-up Units (OPUs) and Photo Detector Integrated Circuits (PDICs). Additionally, multiple standards for AFEs of other devices may be supported. The embodiment mitigates the noise generated on the board-level and chip-level by using a ground noise-balancing technique when performing the single ended to differential conversion. The embodiment also eliminates the common-mode drifting problem by using Current (I) Proportional-To-Absolute Temperature (IPTAT) current compensation.

Figure 1A:
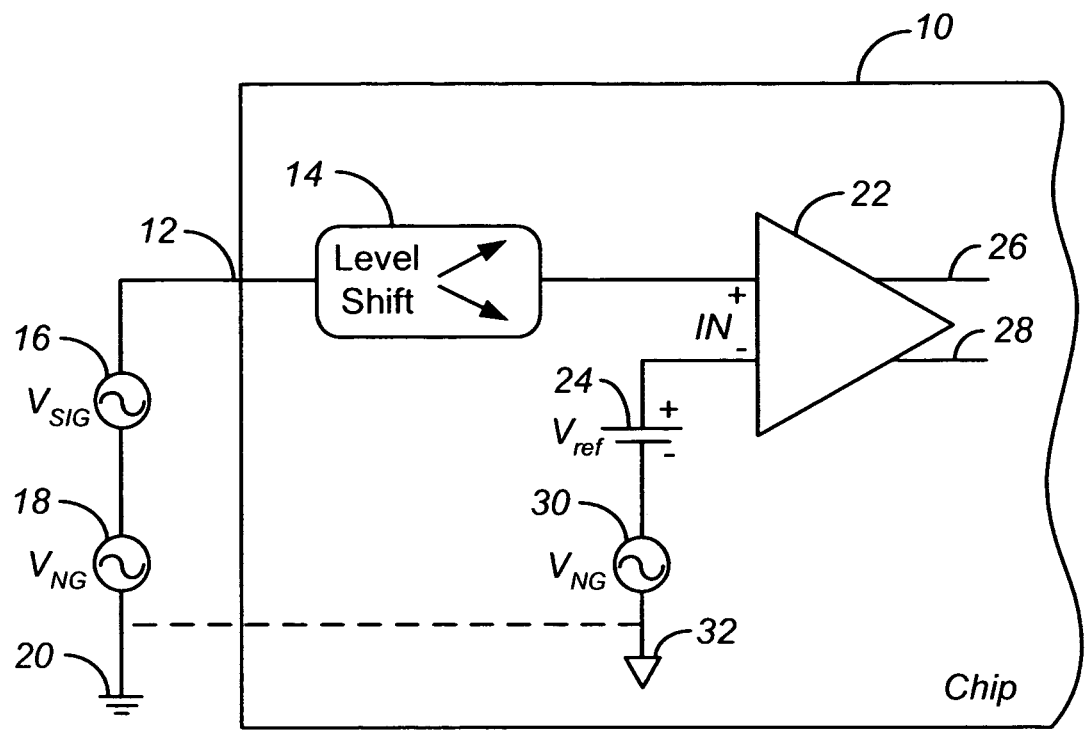
FIGS. 1A-B illustrate the ideal and actual noise coupling from ground.
Figure 1B:
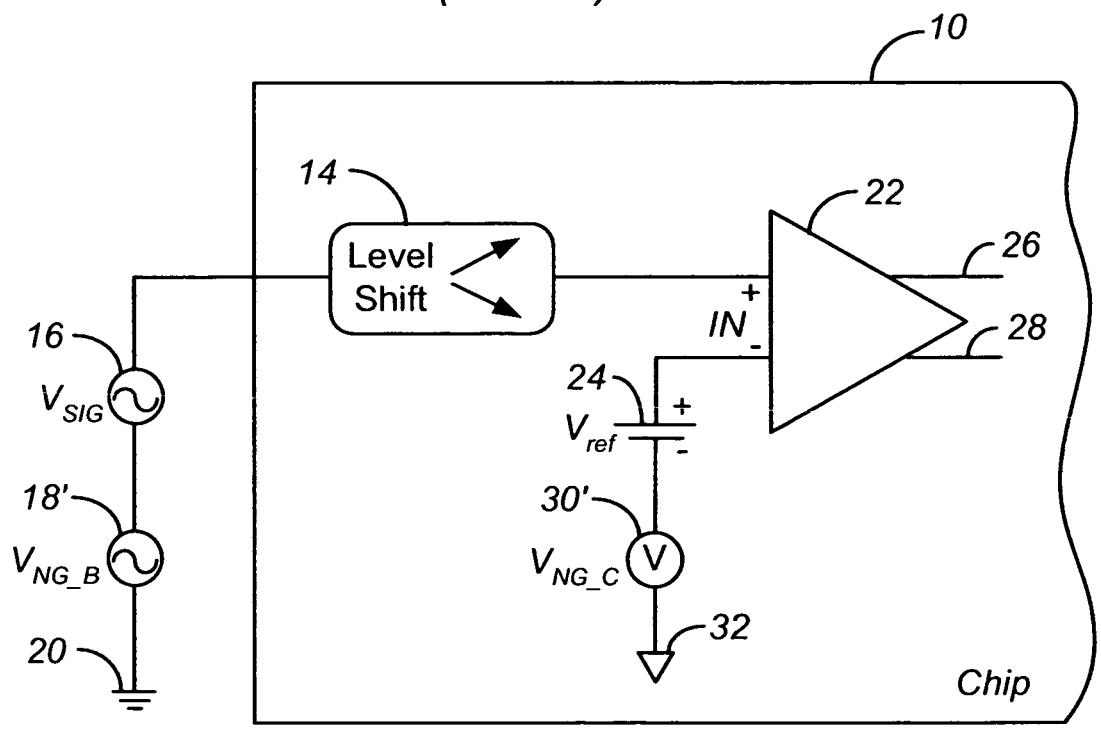
Figure 2A:
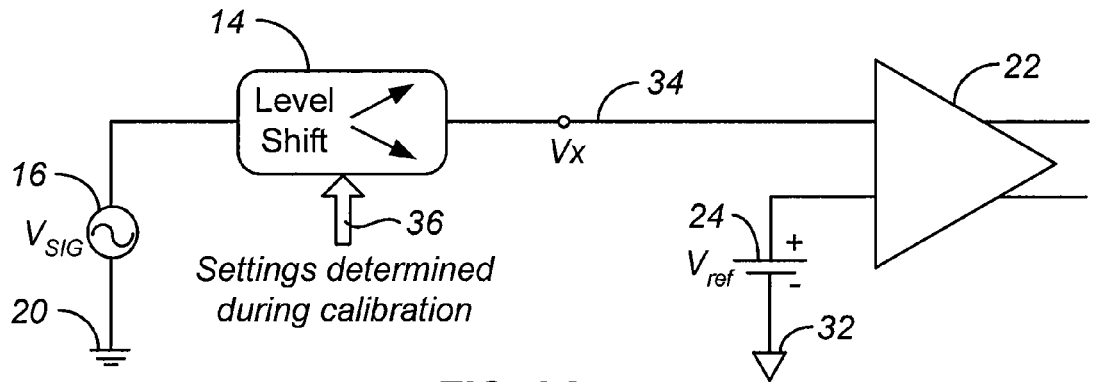
FIG. 2A is a diagram of the basic level shifting and differential circuit of the prior art.
Figure 2B:
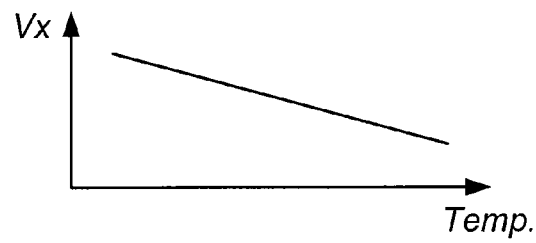
FIGS. 2B-C illustrate the effects of temperature drift on the voltage of the circuit of FIG. 2A.
Figure 2C:
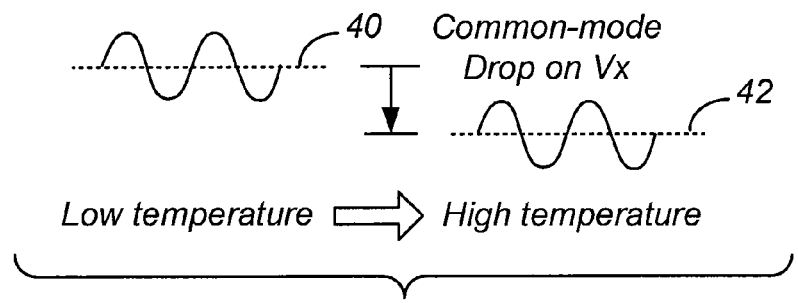
Figure 3:
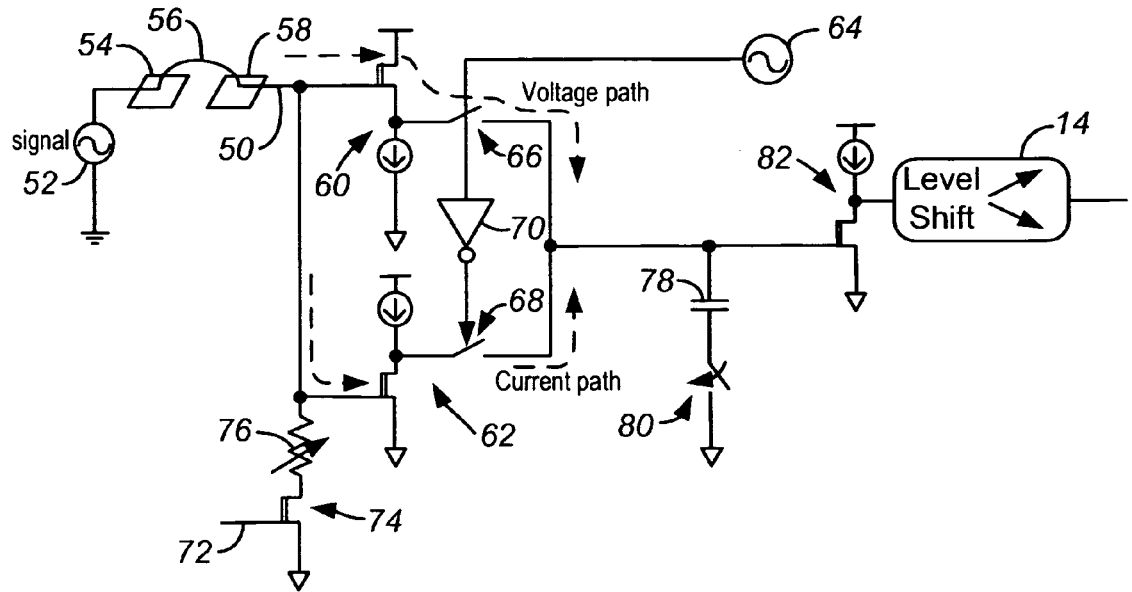
FIG. 3 is a circuit diagram of a dual voltage and current mode AFE according to an embodiment of the invention.

1. Dual Input Source Followers Supporting Both Voltage Mode and Current Mode Operation:

FIG. 3 illustrates a single AFE supporting both voltage and current mode inputs according to one embodiment of the invention. An input 50 receives a signal 52 which can be either a voltage or current signal. Signal 52 is provided from the PCB to a pad 54 on the PCB, across a bonding connection 56 to a pad 58 on the chip. The input signal 52 is provided through one of two voltage buffer circuits, either NMOS source follower 60, or a PMOS source follower 62. If the input is a voltage, control signal 64 causes switch 66 to close, while inverter 70 inverts the control signal 64 to cause switch 68 to open. Thus, the voltage path is connected and the current path is not connected. At the same time, a control line 72 switches off transistor 74, removing the effect of variable terminating resistor 76 on the input.

Conversely, if the input is a current, switch 66 is opened and switch 68 is closed. Also, control line 72 turns on transistor 74, connecting variable resistor 76 to ground, and allowing it to convert the input current into a voltage provided through source-follower 62.

The input signal is next applied to a sampling circuit including capacitor 78 and switch 80, with the sampled signal being provided to PMOS source follower 82, which provides a signal to level shifter 14. Alternatively, the level-shifting capability can be placed before the PMOS source follower 82.

In the current-mode operation, input current injects into the variable termination resistor 76 to ground. The reason for terminating to ground instead of terminating to a predefined reference voltage is to save the area of the NMOS switches that make the termination resistor variable. When terminating the resistor 76 to ground, the gate overdrive of the NMOS switches is basically the supply voltage, hence the ON-resistance of the NMOS switches can be minimized. The size of the NMOS switches can thus be much smaller.

The switches 66, 68, which are used to select the path to be activated, can also act as sampling switches. As shown in FIG. 3, when performing sampling of the input signals, the sampling capacitor 78 is connected to ground via switch 80 and the switches 66, 68 are controlled by control signal 64. Switches 66, 68 can also perform a multiplexing functionality, when voltage and current inputs are alternately applied to input 50.

2. Dedicated Round Pin and Noise Reference Circuit

Figure 4:
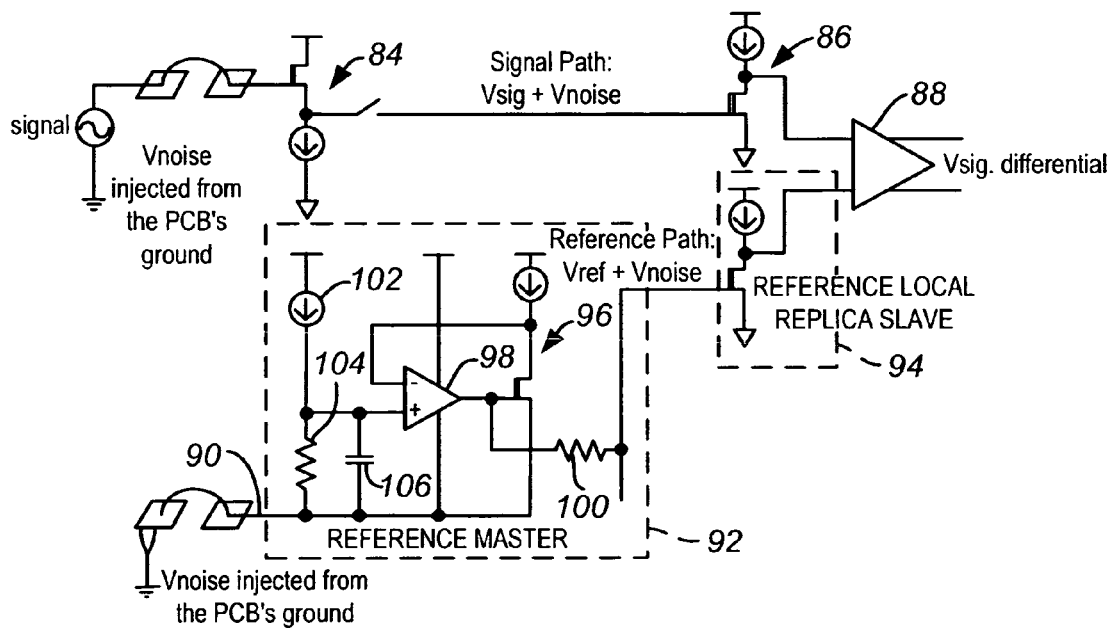
FIG. 4 is a circuit diagram of a ground noise cancellation circuit according to an embodiment of the invention.

FIG. 4 illustrates an embodiment of a noise reference circuit according to the invention. A voltage input is applied through an NMOS source follower 84 and a PMOS source follower 86 to an amplifier (differential circuit) 88 which produces the differential signal.

To obtain the best Signal-to-Noise Ratio (SNR), both positive and negative input terminals of the differential circuit 88 should have the same noise characteristics. Therefore, instead of letting the internal common mode reference voltage (Vref) refer to internal VSS, the common-mode reference voltage refers to the external VSS. This is achieved by having a dedicated VSS pin 90 directly serving the reference path without sharing with other VSS pins on the chip. Since this VSS pin 90 does not share with other pins, virtually no switching activity will affect this VSS pin 90. In other words, no switching current will establish a noise voltage on this pin 90 due to the lead and bond wire inductance. A reference path connects pin 90 to the negative input of differential circuit 88. Given that the reference path has enough bandwidth, the negative input terminal (reference path) of the differential circuit 88 has Vref+Vnoise, where Vnoise is the ground noise on the PCB. The positive input terminal (signal path) of the differential circuit 88, on the other hand, has Vsig+Vref+Vnoise. Vsig is the AC signal which contains the information. Vref is the DC level. The OPU generates Vsig and Vref. The input path picks up the ground noise of the PCB (Vnoise). The Vref on the reference path matches the DC level from the OPU. For instance, OPU delivers Vsig+Vdc, due to the noise, signal path has Vsig+Vdc+Vnoise. The reference path has Vref+Vnoise. Since Vdc=Vref, and Vnoise is the same, the input of circuit 88 is (Vsig+Vdc+Vnoise)−(Vref+Vnoise)= Vsig. The differential circuit 88 does the subtraction of the signal path and reference path and obtain the true signal, Vsig, itself.

The reference path can be implemented in a master-slave manner to establish the common-mode voltage for multiple input channels all together as shown in FIG. 4. A reference master circuit 92 can connect with multiple slave circuits 94. Each slave 94 is associated with a different differential circuit for a different voltage signal input. Reference master circuit 92 includes a PMOS source follower 96 and an operational amplifier 98, which provides a buffer. Also provided are a current source 102, a resistor 104 and a capacitor 106. A resistor 100 is shown connected between the master and slaves. Resistor 100 represents, in one embodiment, line resistance which is matched to the line resistance of the voltage signal path.

3. Temperature Compensation with IPTAT

The common-mode drift of the signal path is caused by the threshold variation and mobility degradation due to temperature variation. Based upon the simulation and experiment results, it is observed that the common-mode voltage is linear with respect to temperature. When temperature increases, the threshold voltage of the MOS transistors decreases resulting in a lower common-mode voltage.

Figure 5A:
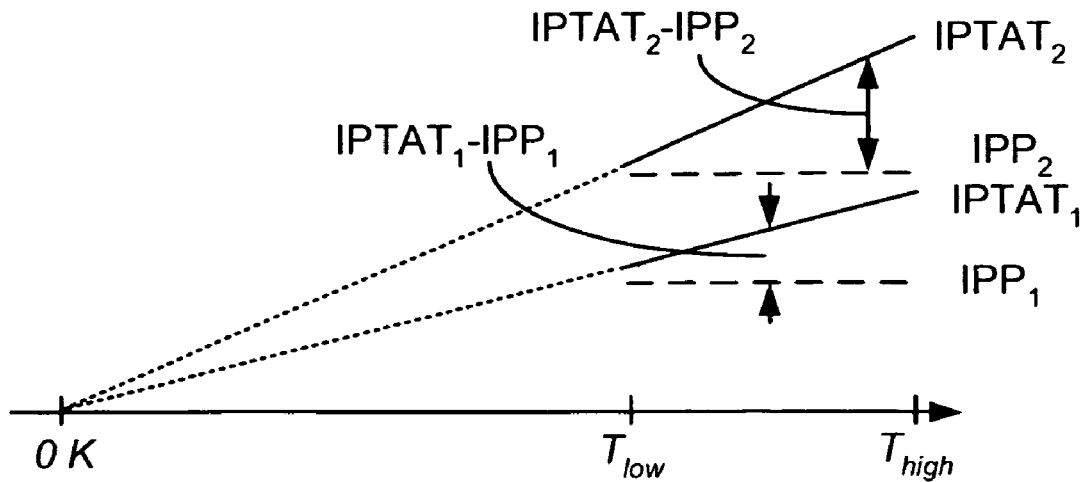
FIG. 5A is a diagram illustrating the current vs. temperature characteristics of an IPTAT circuit as used in an embodiment of the present invention.
Figure 5B:
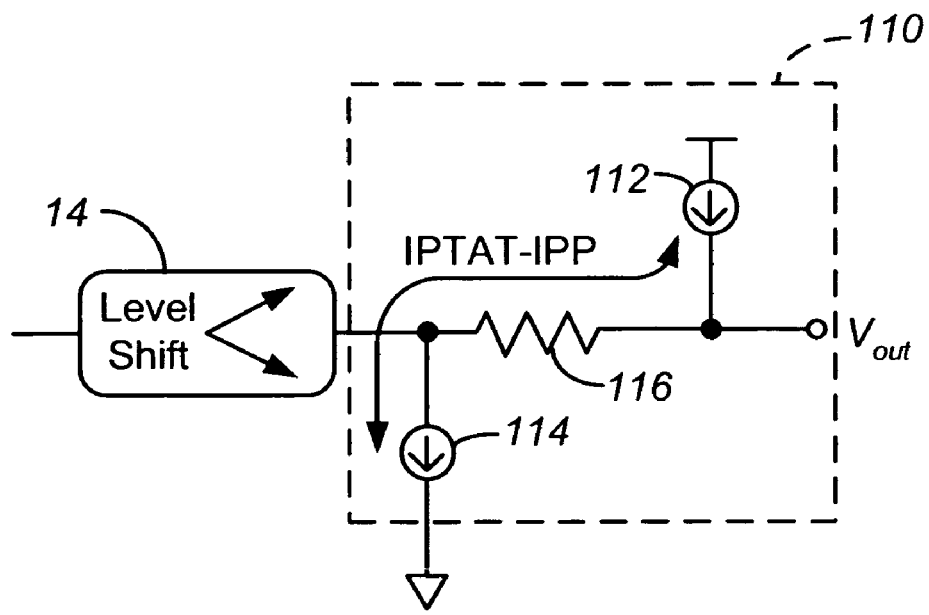
FIG. 5B is a diagram of a temperature drift compensation circuit according to an embodiment of the invention.

As shown in FIG. 5B, to compensate for this temperature effect, an embodiment of the present invention employs a Current (I) Proportional-To-Absolute Temperature (IPTAT) circuit 110. The IPTAT circuit 110 includes current sources 112 and 114, and a resistor 116. It will be appreciated by those of skill in the art that a complete IPTAT circuit may contain other components and have a different design.

The characteristics of the IPTAT circuit 110 are introduced in FIG. 5A. The slope of the current with respect to the temperature depends on the nominal current value. All extrapolated curves with different nominal current value will cross at zero Kelvin. Therefore, by controlling the amount of IPTAT current flowing through a poly-silicon resistor, an automatic "shift-up" circuit can be created that has the same magnitude as the temperature coefficient but a different sign than that of the signal path. Therefore, the overall temperature response of the signal path can be flat. For example, if the common-mode voltage curve of the original signal path has a temperature coefficient of −1.5 mV/° C., the right amount of IPTAT current flowing through a resistor can be designated to create a compensation of +1.5 mV/° C. on the signal path to make the overall temperature response flat. Thus, the appropriate IPTAT is chosen (IPTAT$_1$ or IPTAT$_2$ or some other IPTAT) to match the temperature characteristics of the components used.

To obtain the right temperature coefficient (slope), an excessive amount of steady current may be used with a standard IPTAT circuit. Since both IPTAT and IPP scale with the poly-silicon resistor; IPP can be subtracted from IPTAT such that we can have a current that has the right slope, but almost no wasted steady current. Ipp is a current which is inversely proportional to the temperature and mismatch characteristics of poly resistors. In other words, Ipp times the resistance of a poly resistor gives a constant voltage. It is usually generated somewhere on the chip near the band-gap circuit, which is not shown in the figure. Since the lowest practical operating temperature can be determined, and is higher than 0K, current generated below this point can be eliminated. As shown in FIG. 5A, the subtraction brings the curve to cross the X-axis at the lower-end of the temperature range (Tlow).

Figure 6:
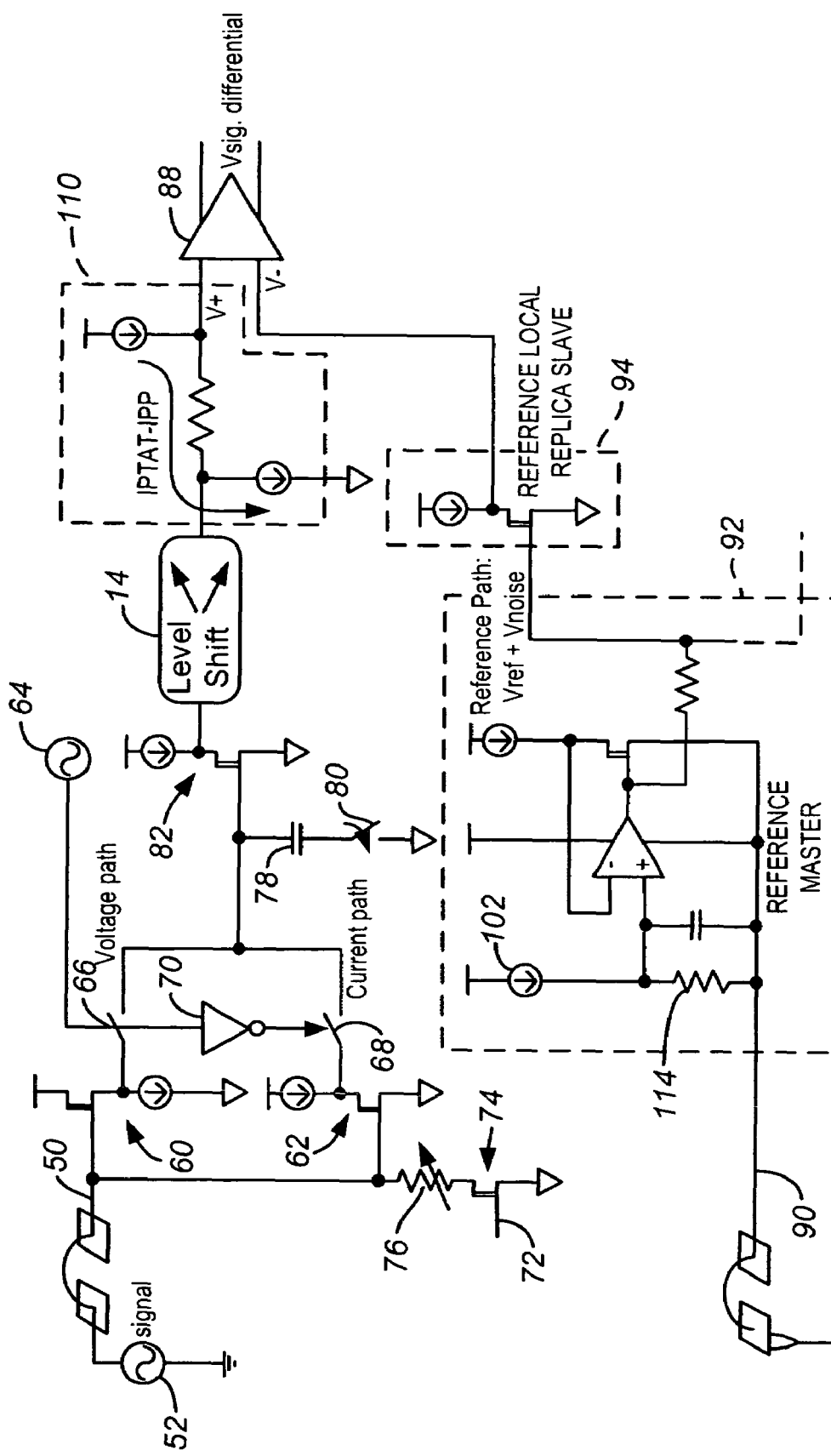
FIG. 6 is a circuit diagram of a combined dual voltage and current AFE, ground noise cancellation circuit and temperature drift compensation circuit according to an embodiment of the invention.

Combined Embodiment with (1) Voltage/Current Modes, (2) Ground Noise Cancellation and (3) Temperature Compensation The overall architecture of a combined embodiment of the invention is shown in FIG. 6. In front of the differential circuit 88, input terminal 50 is connected to the single-ended signal path; the other input 90 is connected to the single-ended reference path. On the signal path, as described earlier, there are multiplexing switches 66 and 68 to select whether voltage-mode or current-mode is active. Voltage mode operation will employ the NMOS source follower 60 (see FIG. 6) while the current mode will employ the PMOS source follower 62. Both operations share the same second PMOS source follower 82. The multiplexing switches 66, 68 can also act as sampling switches during sampling. During current-mode operation, the signal current is converted back to voltage signals by using the variable on-chip termination resistor 76 as described earlier. The level-shifting circuitry 14 can be either between source followers 60, 62 and source follower 82 or after the PMOS source follower 82, as shown.

The reference voltage is generated by injecting an IPP current, using a current source 102, to a resistor 114 that terminates to a dedicated external ground pin 90 (VSS), without sharing with other parts of the chip. The reference voltage, which has identical or very similar ground noise behavior to that on the signal path, is distributed to the negative inputs of the paths. By adding the IPTAT (minus IPP) circuit 110, the DC level on the signal path can remain relatively stable regardless of the temperature variation. Note that the reference voltage is not significantly affected by the temperature variation.

Figure 7A:
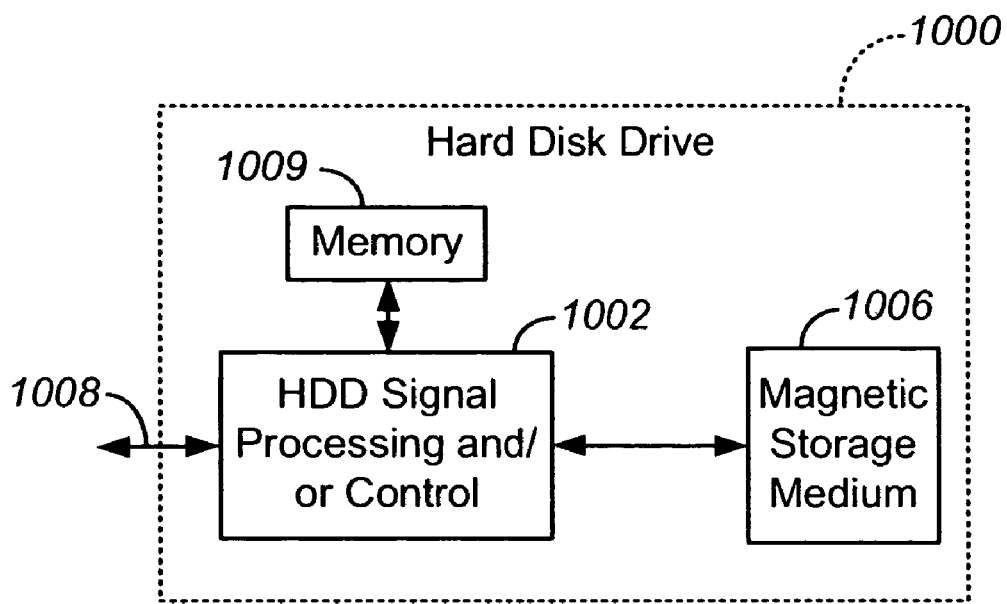
FIGS. 7A-7H show various devices in which the present invention may be embodied.

Referring now to FIGS. 7A-7G, various exemplary implementations of the present invention are shown. Referring to FIG. 7A, the present invention may be embodied in a hard disk drive 1000. The present invention may implement either or both signal processing and/or control circuits, which are generally identified in FIG. 7A at 1002. In some implementations, signal processing and/or control circuit 1002 and/or other circuits (not shown) in HDD 1000 may process data, perform coding and/or encryption, perform calculations, and/or format data that is output to and/or received from a magnetic storage medium 1006.

HDD 1000 may communicate with a host device (not shown) such as a computer, mobile computing devices such as personal digital assistants, cellular phones, media or MP3 players and the like, and/or other devices via one or more wired or wireless communication links 1008. HDD 1000 may be connected to memory 1009, such as random access memory (RAM), a low latency nonvolatile memory such as flash memory, read only memory (ROM) and/or other suitable electronic data storage.

Figure 7B:
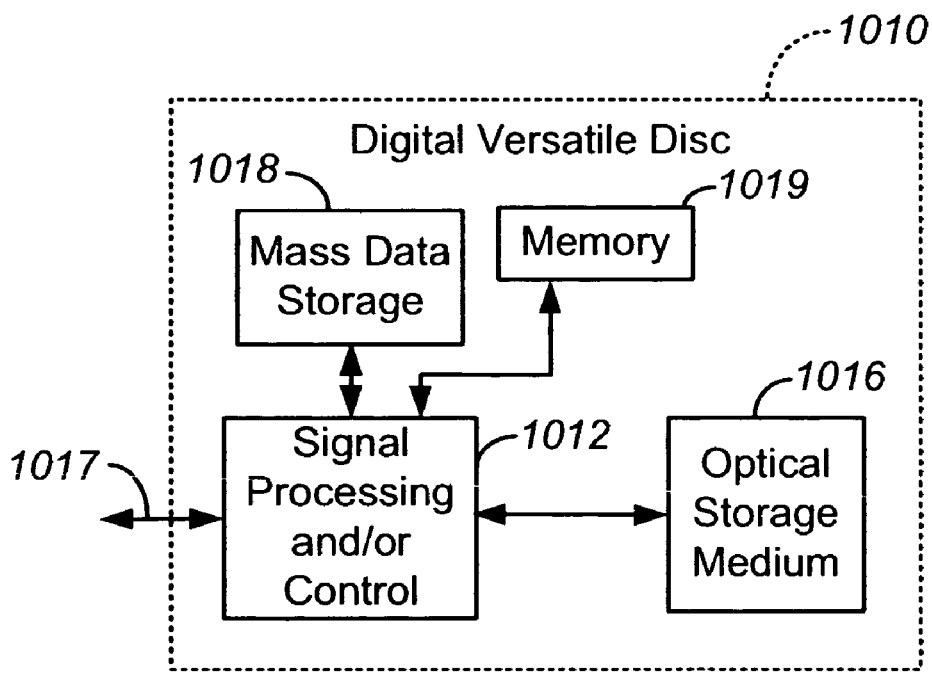

Referring now to FIG. 7B, the present invention may be embodied in a digital versatile disc (DVD) drive 1010. The present invention may implement either or both signal processing and/or control circuits, which are generally identified in FIG. 7B at 1012, and/or mass data storage 1018 of DVD drive 1010. Signal processing and/or control circuit 1012 and/or other circuits (not shown) in DVD 1010 drive may process data, perform coding and/or encryption, perform calculations, and/or format data that is read from and/or data written to an optical storage medium 1016. In some implementations, signal processing and/or control circuit 1012 and/or other circuits (not shown) in DVD drive 1010 can also perform other functions such as encoding and/or decoding and/or any other signal processing functions associated with a DVD drive.

DVD drive 1010 may communicate with an output device (not shown) such as a computer, television or other device via one or more wired or wireless communication links 1017. DVD drive 1010 may communicate with mass data storage 1018 that stores data in a nonvolatile manner. Mass data storage 1018 may include a hard disk drive (HDD) such as that shown in FIG. 7A. The HDD may be a mini HDD that includes one or more platters having a diameter that is smaller than approximately 1.8"DVD drive 1010 may be connected to memory 1019, such as RAM, ROM, low latency nonvolatile memory such as flash memory, and/or other suitable electronic data storage.

Figure 7C:
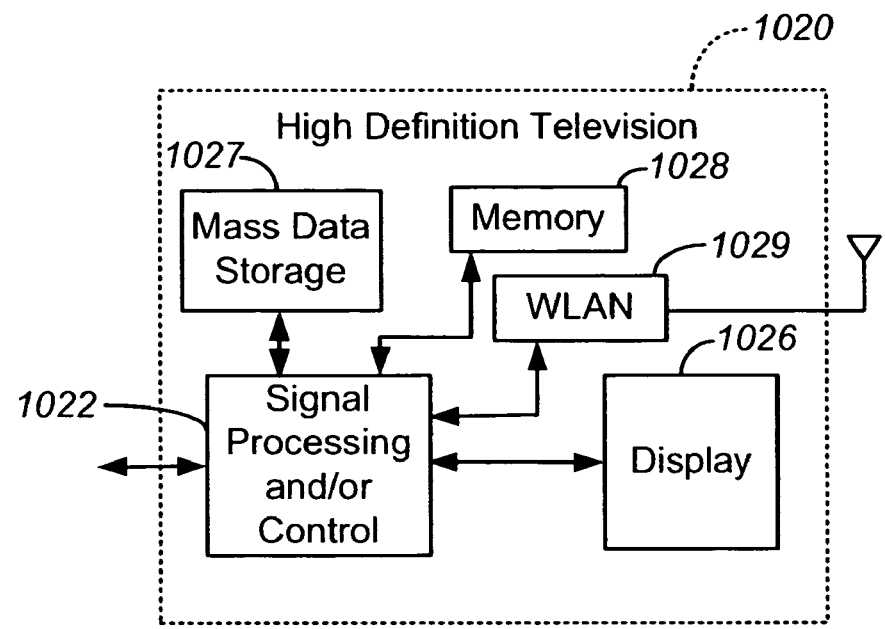

Referring now to FIG. 7C, the present invention may be embodied in a high definition television (HDTV) 1020. The present invention may implement either or both signal processing and/or control circuits, which are generally identified in FIG. 7C at 1022, a WLAN interface and/or mass data storage of the HDTV 1020. HDTV 1020 receives HDTV input signals in either a wired or wireless format and generates HDTV output signals for a display 1026. In some implementations, signal processing circuit and/or control circuit 1022 and/or other circuits (not shown) of HDTV 1020 may process data, perform coding and/or encryption, perform calculations, format data and/or perform any other type of HDTV processing that may be required.

HDTV 1020 may communicate with mass data storage 1027 that stores data in a nonvolatile manner such as optical and/or magnetic storage devices. At least one HDD may have the configuration shown in FIG. 7A and/or at least one DVD drive may have the configuration shown in FIG. 7B. The HDD may be a mini HDD that includes one or more platters having a diameter that is smaller than approximately 1.8"HDTV 1020 may be connected to memory 1028 such as RAM, ROM, low latency nonvolatile memory such as flash memory and/or other suitable electronic data storage. HDTV 1020 also may support connections with a WLAN via a WLAN network interface 1029.

Figure 7D:
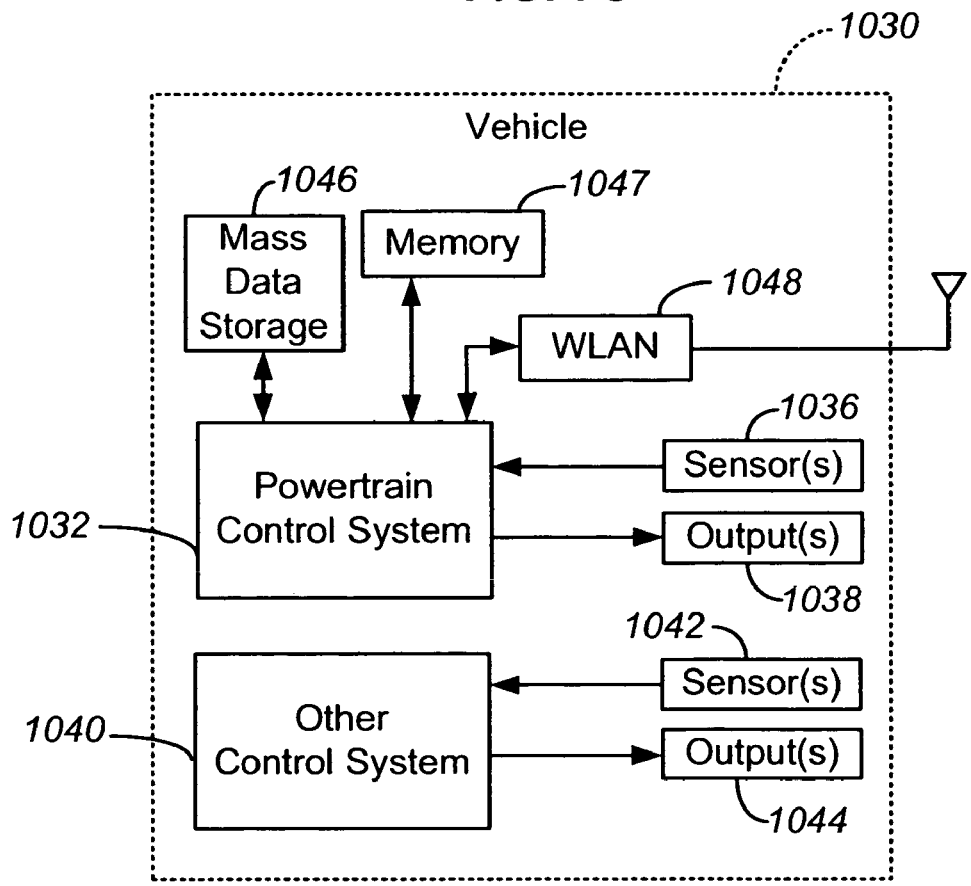

Referring now to FIG. 7D, the present invention may be embodied in a control system, a WLAN interface and/or mass data storage of a vehicle 1030. In some implementations, the present invention implements a powertrain control system 1032 that receives inputs from one or more sensors such as temperature sensors, pressure sensors, rotational sensors, air-flow sensors and/or any other suitable sensors and/or that generates one or more output control signals such as engine operating parameters, transmission operating parameters, and/or other control signals.

The present invention may also be embodied in other control system 1040 of vehicle 1030. Control system 1040 may likewise receive signals from input sensors 1042 and/or output control signals to one or more output devices 1044. In some implementations, control system 1040 may be part of an anti-lock braking system (ABS), a navigation system, a telematics system, a vehicle telematics system, a lane departure system, an adaptive cruise control system, a vehicle entertainment system such as a stereo, DVD, compact disc system and the like. Still other implementations are contemplated.

Powertrain control system 1032 may communicate with mass data storage 1046 that stores data in a nonvolatile manner. Mass data storage 1046 may include optical and/or magnetic storage devices for example HDDs and/or DVD drives. At least one HDD may have the configuration shown in FIG. 7A and/or at least one DVD drive may have the configuration shown in FIG. 7B. The HDD may be a mini HDD that includes one or more platters having a diameter that is smaller than approximately 1.8". Powertrain control system 1032 may be connected to memory 1047 such as RAM, ROM, low latency nonvolatile memory such as flash memory and/or other suitable electronic data storage. Powertrain control system 1032 also may support connections with a WLAN via a WLAN network interface 1048. The control system 1040 may also include mass data storage, memory and/or a WLAN interface (all not shown).

Figure 7E:
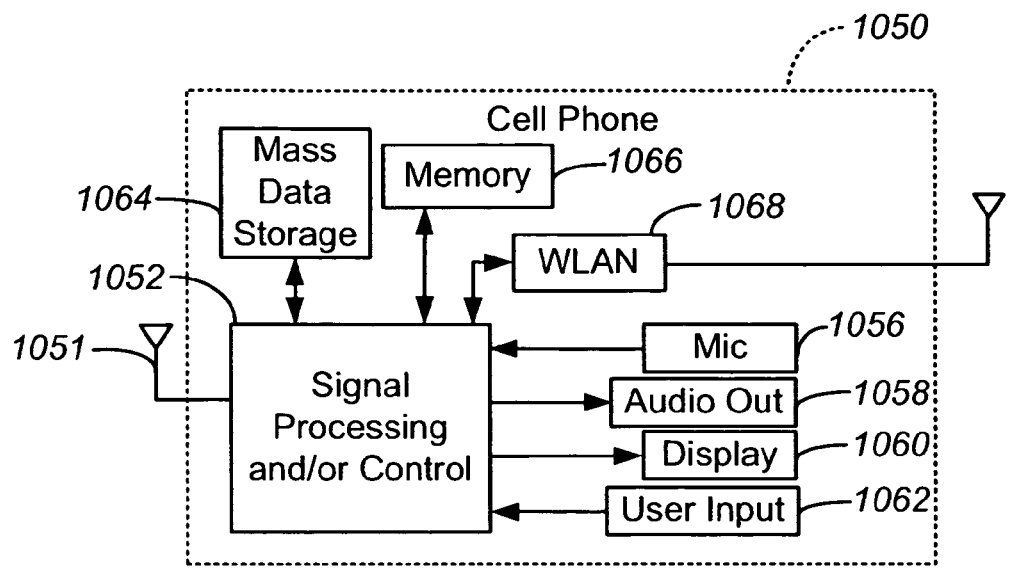

Referring now to FIG. 7E, the present invention may be embodied in a cellular phone 1050 that may include a cellular antenna 1051. The present invention may implement either or both signal processing and/or control circuits, which are generally identified in FIG. 7E at 1052, a WLAN interface and/or mass data storage of the cellular phone 1050. In some implementations, cellular phone 1050 includes a microphone 1056, an audio output 1058 such as a speaker and/or audio output jack, a display 1060 and/or an input device 1062 such as a keypad, pointing device, voice actuation and/or other input device. Signal processing and/or control circuits 1052 and/or other circuits (not shown) in cellular phone 1050 may process data, perform coding and/or encryption, perform calculations, format data and/or perform other cellular phone functions.

Cellular phone 1050 may communicate with mass data storage 1064 that stores data in a nonvolatile manner such as optical and/or magnetic storage devices for example HDDs and/or DVD drives. At least one HDD may have the configuration shown in FIG. 7A and/or at least one DVD drive may have the configuration shown in FIG. 7B. The HDD may be a mini HDD that includes one or more platters having a diameter that is smaller than approximately 1.8". Cellular phone 1050 may be connected to memory 1066 such as RAM, ROM, low latency nonvolatile memory such as flash memory and/or other suitable electronic data storage. Cellular phone 1050 also may support connections with a WLAN via a WLAN network interface 1068.

Figure 7F:
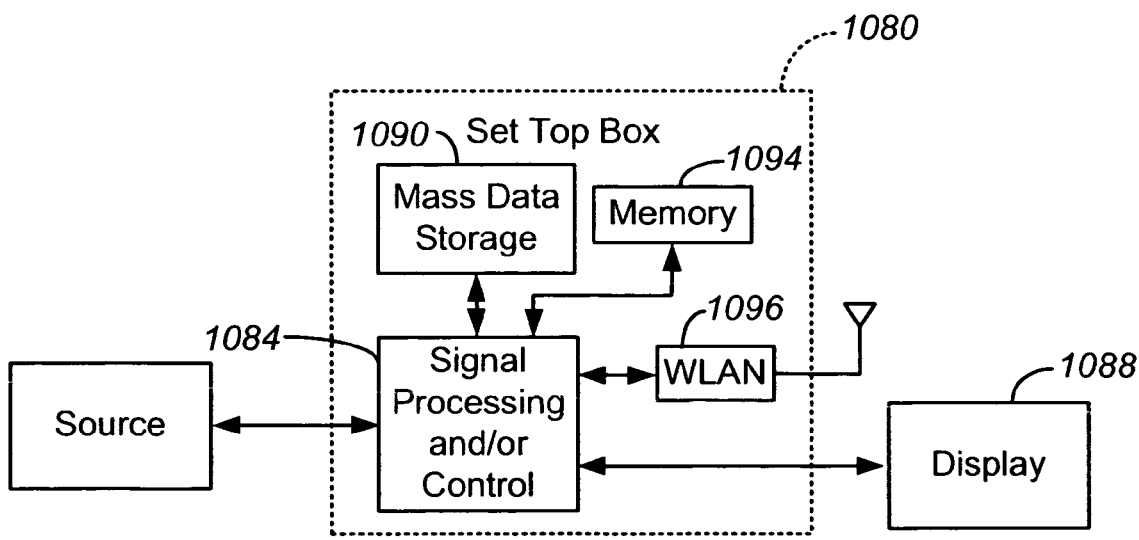

Referring now to FIG. 7F, the present invention may be embodied in a set top box 1080. The present invention may implement either or both signal processing and/or control circuits, which are generally identified in FIG. 7F at 1084, a WLAN interface and/or mass data storage of the set top box 1080. Set top box 1080 receives signals from a source such as a broadband source and outputs standard and/or high definition audio/video signals suitable for a display 1088 such as a television and/or monitor and/or other video and/or audio output devices. Signal processing and/or control circuits 1084 and/or other circuits (not shown) of the set top box 1080 may process data, perform coding and/or encryption, perform calculations, format data and/or perform any other set top box function.

Set top box 1080 may communicate with mass data storage 1090 that stores data in a nonvolatile manner. Mass data storage 1090 may include optical and/or magnetic storage devices for example HDDs and/or DVD drives. At least one HDD may have the configuration shown in FIG. 7A and/or at least one DVD drive may have the configuration shown in FIG. 7B. The HDD may be a mini HDD that includes one or more platters having a diameter that is smaller than approximately 1.8". Set top box 1080 may be connected to memory 1094 such as RAM, ROM, low latency nonvolatile memory such as flash memory and/or other suitable electronic data storage. Set top box 1080 also may support connections with a WLAN via a WLAN network interface 1096.

Figure 7G:
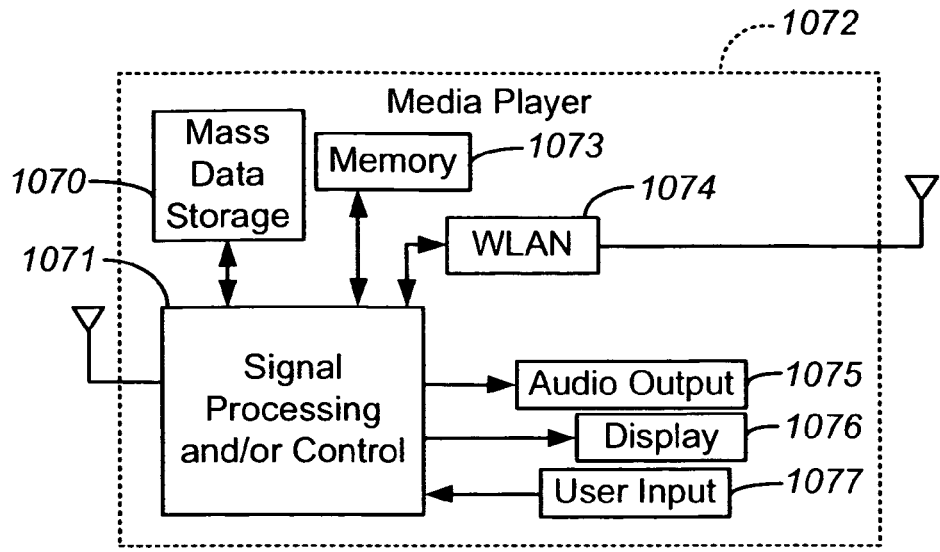

Referring now to FIG. 7G, the present invention may be embodied in a media player 1072. The present invention may implement either or both signal processing and/or control circuits, which are generally identified in FIG. 7G at 1071, a WLAN interface and/or mass data storage of the media player 1072. In some implementations, media player 1072 includes a display 1076 and/or a user input 1077 such as a keypad, touchpad and the like. In some implementations, media player 1072 may employ a graphical user interface (GUI) that typically employs menus, drop down menus, icons and/or a point-and-click interface via display 1076 and/or user input 1077. Media player 1072 further includes an audio output 1075 such as a speaker and/or audio output jack. Signal processing and/or control circuits 1071 and/or other circuits (not shown) of media player 1072 may process data, perform coding and/or encryption, perform calculations, format data and/or perform any other media player function.

Media player 1072 may communicate with mass data storage 1070 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example HDDs and/or DVD drives. At least one HDD may have the configuration shown in FIG. 7A and/or at least one DVD drive may have the configuration shown in FIG. 7B. The HDD may be a mini HDD that includes one or more platters having a diameter that is smaller than approximately 1.8". Media player 1072 may be connected to memory 1073 such as RAM, ROM, low latency nonvolatile memory such as flash memory and/or other suitable electronic data storage. Media player 1072 also may support connections with a WLAN via a WLAN network interface 1074.

Figure 7H:
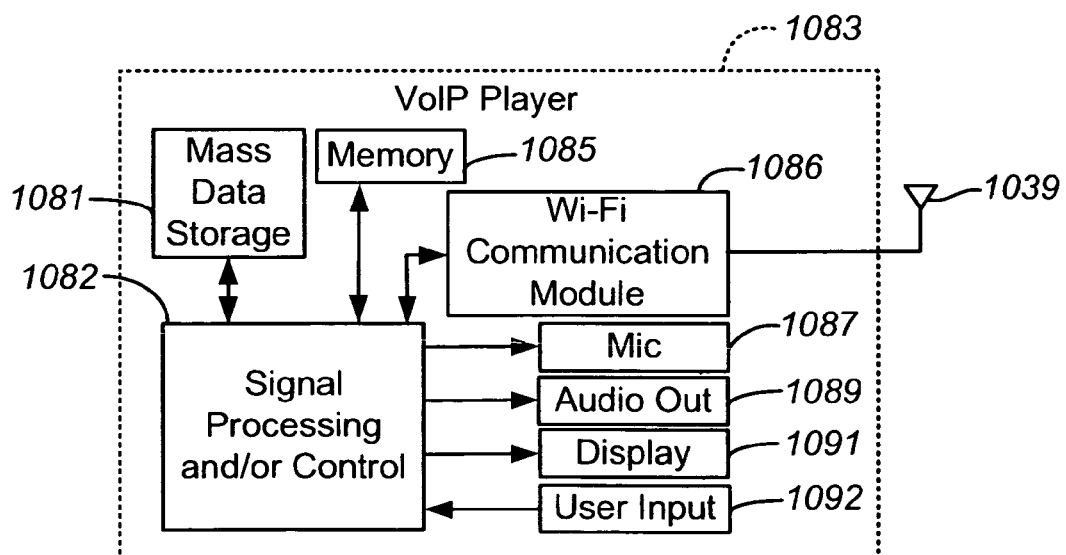

Referring to FIG. 7H, the present invention may be embodied in a Voice over Internet Protocol (VoIP) phone 1083 that may include an antenna 1039. The present invention may implement either or both signal processing and/or control circuits, which are generally identified in FIG. 7H at 1082, a wireless interface and/or mass data storage of the VoIP phone 1083. In some implementations, VoIP phone 1083 includes, in part, a microphone 1087, an audio output 1089 such as a speaker and/or audio output jack, a display monitor 1091, an input device 1092 such as a keypad, pointing device, voice actuation and/or other input devices, and a Wireless Fidelity (Wi-Fi) communication module 1086. Signal processing and/or control circuits 1082 and/or other circuits (not shown) in VoIP phone 1083 may process data, perform coding and/or encryption, perform calculations, format data and/or perform other VoIP phone functions.

VoIP phone 1083 may communicate with mass data storage 1081 that stores data in a nonvolatile manner such as optical and/or magnetic storage devices, for example HDDs and/or DVD drives. At least one HDD may have the configuration shown in FIG. 7A and/or at least one DVD drive may have the configuration shown in FIG. 7B. The HDD may be a mini HDD that includes one or more platters having a diameter that is smaller than approximately 1.8". VoIP phone 1083 may be connected to memory 1085, which may be a RAM, ROM, low latency nonvolatile memory such as flash memory and/or other suitable electronic data storage. VoIP phone 1083 is configured to establish communications link with a VoIP network (not shown) via Wi-Fi communication module 1086. Still other implementations in addition to those described above are contemplated.

As will be understood by those of skill in the art, the present invention could be embodied in other specific forms without departing from the essential characteristics thereof. For example, the level shifter could be placed before the PMOS source follower, or the temperature compensation circuit could be placed before the level shifter. Accordingly, the foregoing description is intended to be illustrative, but not limiting, of the scope of the invention, which is set forth in the following claims.

What is claimed is:

1. An analog front end circuit comprising:
   an input terminal;
   a voltage input path including:
      a first voltage buffer circuit in communication with said input terminal, and
      a first switch coupled to an output of said first voltage buffer circuit;
   a current input path including:
      a second voltage buffer circuit in communication with said input terminal,
      a current to voltage conversion circuit in communication with said input terminal and said second voltage buffer circuit, and
      a second switch coupled to an output of said second voltage buffer circuit;
   a control circuit, coupled to said first and second switches, to alternately select the voltage input path or the current input path;
   a temperature compensation circuit in communication with said first and second switches, wherein said temperature compensation circuit comprises an IPTAT-IPP circuit;
   a sampling circuit alternately coupled to said first and second switches;
   a PMOS source follower coupled to an output of said sampling circuit; and
   a level shifter coupled between said PMOS source follower and said temperature compensation circuit.

2. An analog front end circuit comprising:
   an input terminal;
   a voltage input path including:
      a first voltage buffer circuit in communication with said input terminal, and
      a first switch coupled to an output of said first voltage buffer circuit;
   a current input path including:
      a second voltage buffer circuit in communication with said input terminal, a current to voltage conversion circuit in communication with said input terminal and said second voltage buffer circuit, and a second switch coupled to an output of said second voltage buffer circuit;

a control circuit, coupled to said first and second switches, to alternately select the voltage input path or the current input path; and a control circuit connected to said current to voltage conversion circuit to turn off said current to voltage conversion circuit during a voltage input mode.

3. The circuit of claim 2 wherein said first voltage buffer circuit is an NMOS source follower.

4. The circuit of claim 2 wherein said second voltage buffer circuit is a PMOS source follower.

5. The circuit of claim 2 further comprising a sampling circuit in communication with said first and second switches.

6. The circuit of claim 2 further comprising:
a PMOS source follower in communication with said first and second switches.

7. The circuit of claim 2 further comprising:
a level shifter in communication with said first and second switches.

8. The circuit of claim 7 further comprising:
a differential circuit in communication with an output of said level shifter.

9. The circuit of claim 8 further comprising:
a dedicated ground terminal in communication with a negative input of said differential circuit.

10. The circuit of claim 9 wherein said dedicated ground terminal is in communication with negative inputs of a plurality of differential circuits.

11. The circuit of claim 10 further comprising:
a master reference circuit in communication with said dedicated ground terminal; and
a plurality of local slave reference circuits, each coupled between said master reference circuit and one of said negative inputs of said plurality of differential circuits.

12. An analog front end circuit comprising:
an input terminal;
a voltage input path including
an NMOS source follower circuit in communication with said input terminal, and
a first switch coupled to an output of said NMOS source follower circuit;
a current input path including
a first PMOS source follower circuit in communication with said input terminal,
a current to voltage conversion circuit in communication with said input terminal and said first PMOS source follower circuit, and
a second switch coupled to an output of said first PMOS source follower circuit;
a control circuit, coupled to said first and second switches, to alternately select the voltage input path or the current input path;
a second PMOS source follower circuit in communication with said first and second switches;
a level shifter in communication with said second PMOS source follower circuit;
a differential circuit in communication with an output of said level shifter;
a dedicated ground terminal in communication with a negative input of said differential circuit; and an IPTAT temperature compensation circuit in communication with a positive input of said differential circuit.

13. An analog front end circuit comprising:
an input terminal;
a voltage input path including:
a first voltage buffer circuit in communication with said input terminal, and
a first switch coupled to an output of said first voltage buffer circuit;
a current input path including:
a second voltage buffer circuit in communication with said input terminal,
a current to voltage conversion circuit in communication with said input terminal and said second voltage buffer circuit, and
a second switch coupled to an output of said second voltage buffer circuit;
a control circuit, coupled to said first and second switches, to alternately select the voltage input path or the current input path;
a temperature compensation circuit in communication with said first and second switches;
a sampling circuit alternately coupled to said first and second switches;
a PMOS source follower coupled to an output of said sampling circuit; and
a level shifter coupled between said PMOS source follower and said temperature compensation circuit.

14. The circuit of claim 13 wherein said first voltage buffer circuit is an NMOS source follower.

15. The circuit of claim 13 wherein said second voltage buffer circuit is a PMOS source follower.

16. The circuit of claim 13 wherein said a sampling circuit is in communication with said first and second switches.

17. The circuit of claim 13 further comprising a PMOS source follower in communication with said first and second switches.

18. The circuit of claim 13 wherein said level shifter is in communication with said first and second switches.

19. The circuit of claim 18 further comprising a differential circuit in communication with an output of said level shifter.

20. The circuit of claim 19 further comprising a dedicated ground terminal in communication with a negative input of said differential circuit.

21. The circuit of claim 20 wherein said dedicated ground terminal is in communication with negative inputs of a plurality of differential circuits.

22. The circuit of claim 21 further comprising:
a master reference circuit in communication with said dedicated ground terminal; and
a plurality of local slave reference circuits, each coupled between said master reference circuit and one of said negative inputs of said plurality of differential circuits.

23. The circuit of claim 13 wherein said temperature compensation circuit comprises an IPTAT circuit.

24. The circuit of claim 23 wherein said IPTAT circuit is a IPTAT-IPP circuit.

25. The circuit of claim 13 further comprising a control circuit connected to said current to voltage conversion circuit to turn off said current to voltage conversion circuit during a voltage input mode.

* * * * *